(12) United States Patent
Popescu-Stroe et al.

(10) Patent No.: US 11,165,414 B2
(45) Date of Patent: Nov. 2, 2021

(54) RECONFIGURABLE FILTER NETWORK WITH SHORTENED SETTLING TIME

(71) Applicant: Infineon Technologies AG, Neubiberg (DE)

(72) Inventors: Victor Popescu-Stroe, Bucharest (RO); Dan-Alexandru Mocanu, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 90 days.

(21) Appl. No.: 16/723,223

(22) Filed: Dec. 20, 2019

(65) Prior Publication Data

US 2021/0194465 A1 Jun. 24, 2021

(51) Int. Cl.
*H03H 17/02* (2006.01)

(52) U.S. Cl.
CPC .... *H03H 17/0288* (2013.01); *H03H 17/0292* (2013.01)

(58) Field of Classification Search
CPC .................. H03H 17/0288; H03H 17/0292
See application file for complete search history.

(56) References Cited

U.S. PATENT DOCUMENTS

| | | | | |
|---|---|---|---|---|
| 5,428,563 A | * | 6/1995 | Takenaka | H03H 17/0294 708/300 |
| 2003/0234693 A1 | * | 12/2003 | Staszewski | H03L 7/093 331/16 |
| 2005/0210092 A1 | | 9/2005 | Ferguson | |
| 2006/0021498 A1 | | 2/2006 | Moroz et al. | |
| 2007/0016316 A1 | * | 1/2007 | Hanna | G10L 19/008 700/94 |
| 2008/0315960 A1 | * | 12/2008 | Waheed | H04L 27/0014 331/17 |
| 2009/0055149 A1 | | 2/2009 | Hayter et al. | |
| 2009/0154622 A1 | | 6/2009 | Subrahmanyan et al. | |
| 2011/0312294 A1 | | 12/2011 | Thampi et al. | |
| 2015/0310872 A1 | | 10/2015 | Rathi | |

FOREIGN PATENT DOCUMENTS

| | | |
|---|---|---|
| EP | 3483884 A1 | 5/2019 |
| WO | 9116769 A1 | 10/1991 |
| WO | 2007079097 A2 | 7/2007 |

* cited by examiner

*Primary Examiner* — Chuong D Ngo
(74) *Attorney, Agent, or Firm* — Slater Matsil, LLP

(57) ABSTRACT

A filter circuit includes a first stage comprising a first infinite impulse response (IIR) filter; a third stage comprising a third IIR filter; and a second stage interposed between the first stage and the third stage, the second stage comprising a second IIR filter, where an output terminal of the first IIR filter is coupled to an input terminal of the second IIR filter, and an output terminal of the second IIR filter is coupled to an input terminal of the third IIR filter, where the second stage of the filter circuit is configured to operate in an acquisition mode when a transient is detected in an input signal to the first IIR filter, where during the acquisition mode, the second stage of the filter circuit is bypassed.

21 Claims, 11 Drawing Sheets

1000

```
Monitor an input signal and an output signal of a filter network, the filter network comprising a
first infinite impulse response (IIR) filter, a second IIR filter, and a third IIR filter coupled in series,    ← 1010
wherein the second IIR filter is coupled between the first IIR filter and the third IIR filter, wherein
the first IIR filter, the second IIR filter, and the third IIR filter are first-order IIR filters
```

```
Detect a transient in the input signal of the filter network    ← 1020
```

```
In response to detecting the transient, operate the second IIR filter in an acquisition mode, wherein
operating the second IIR filter in the acquisition mode comprises: for each input sample of the filter    ← 1030
network, loading a scaled value of an output of the first IIR filter into a register of the second IIR filter
```

Fig. 12

# RECONFIGURABLE FILTER NETWORK WITH SHORTENED SETTLING TIME

TECHNICAL FIELD

The present invention relates generally to a filter network, and, in particular embodiments, to a reconfigurable filter network which changes its operation mode in response to a transient in its input to achieve shortened settling time.

BACKGROUND

Filter networks (also referred to as filters, or filter circuits) are used extensively in electrical systems. Filter networks may be used to achieve various functions, such as shaping the spectrum of a signal, band limiting a signal (e.g., low-pass filtering, band-pass filtering, or high-pass filtering), or rejecting out-of-band signals. Filter networks are often implemented as digital filters, which may be integrated in, e.g., integrated circuit (IC) devices to provide electrical devices with enhanced functionalities at reduced costs.

Typically, in the design of a digital filter, a trade-off between the performance of the filter and the cost (e.g., complexity) of the filter is made. For example, it may be advantageous to have a sharp transition from the passband of the filter to the stopband of the filter, in order to reject out-of-band noise more efficiently. However, a sharp transition may require a longer filter (e.g., more filter taps) and/or a more complex filter design, which may require more hardware, thereby increasing the area and the cost of the filter. In addition, a long filter or a complex filter with a sharp transition between the passband and the stopband may need a long settling time when there is a transient (e.g., a sudden change, such as a step increase or step decrease with an amplitude larger than a pre-determined threshold) in the input signal to the filter. The long settling time may negatively impact the dynamic performance of the filter. For example, it may take longer for the output of the filter to settle down at (e.g., converge to) a steady state value in response to a transient in its input signal. Therefore, there is a need in the art for a filter network that has a simple structure (low cost), good out-of-band rejection (e.g., sharp transition), and quick settling time.

SUMMARY

In accordance with a preferred embodiment of the present invention, a filter circuit includes: a first stage comprising a first infinite impulse response (IIR) filter; a third stage comprising a third IIR filter; and a second stage interposed between the first stage and the third stage, the second stage comprising a second IIR filter, wherein an output terminal of the first IIR filter is coupled to an input terminal of the second IIR filter, and an output terminal of the second IIR filter is coupled to an input terminal of the third IIR filter, wherein the second stage of the filter circuit is configured to operate in an acquisition mode when a transient is detected in an input signal to the first IIR filter, wherein during the acquisition mode, the second stage of the filter circuit is bypassed.

In accordance with a preferred embodiment of the present invention, a system includes: a microelectromechanical systems (MEMS) sensor and a filter network comprising: a first infinite impulse response (IIR) filter, an input terminal of the first IIR filter coupled to an output terminal of the MEMS sensor; a third IIR filter, an output terminal of the third IIR filter coupled to an output terminal of the filter network; and a second IIR filter coupled between the first IIR filter and the third IIR filter, wherein the second IIR filter is configured to operate in a first mode or a second mode, wherein the filter network has a first convergence speed when the second IIR filter operates in the first mode, and the filter network has a second convergence speed slower than the first convergence speed when the second IIR filter operates in the second mode. The system further includes a monitor circuit coupled to the filter network, wherein the monitor circuit is configured to: detect a transient in an input signal at the input terminal of the first IIR filter; and set the second IIR filter to operate in the first mode in response to detecting the transient.

In accordance with a preferred embodiment of the present invention, a filter network includes a first infinite impulse response (IIR) filter, a second IIR filter, and a third IIR filter coupled in series, wherein the second IIR filter is coupled between the first IIR filter and the third IIR filter, wherein the first IIR filter, the second IIR filter, and the third IIR filter are first-order IIR filters. A method of operating the filter network includes: monitoring an input signal and an output signal of the filter network; detecting a transient in the input signal of the filter network; and in response to detecting the transient, operating the second IIR filter in an acquisition mode, wherein operating the second IIR filter in the acquisition mode comprises: for each input sample of the filter network, loading a scaled value of an output of the first IIR filter into a register of the second IIR filter.

BRIEF DESCRIPTION OF THE DRAWINGS

For a more complete understanding of the present invention, and the advantages thereof, reference is now made to the following descriptions taken in conjunction with the accompanying drawings, in which:

FIG. 12 is a flow diagram of a method of operating a filter network, in an embodiment.

DETAILED DESCRIPTION OF ILLUSTRATIVE EMBODIMENTS

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to example embodiments in a specific context, namely a reconfigurable filter network that adjusts its operation mode to achieve quick settling time in response to a transient in its input signal.

In an embodiment of the present invention, a reconfigurable filter network includes a first stage filter, a second stage filter, and a third stage filter. The second stage filter is interposed between the first stage filter and the third stage filter. Each of the first stage filter, the second stage filter, and the third stage filter includes an infinite impulse response (IIR) filter. When a transient at the input of the filter network is detected, to reduce the settling time of the filter network, the filter network is set into an acquisition mode, and the second stage filter is bypassed in the acquisition mode, in some embodiments. The second stage filter may be bypassed by loading scaled versions of the output of the first stage filter into respective memory elements of the second stage filter for each input sample at the input of the filter network. When no transient at the input of the filter network is detected, the filter network is set into a tracking mode, and the second stage filter functions as an IIR filter in the tracking mode.

Figure 1:
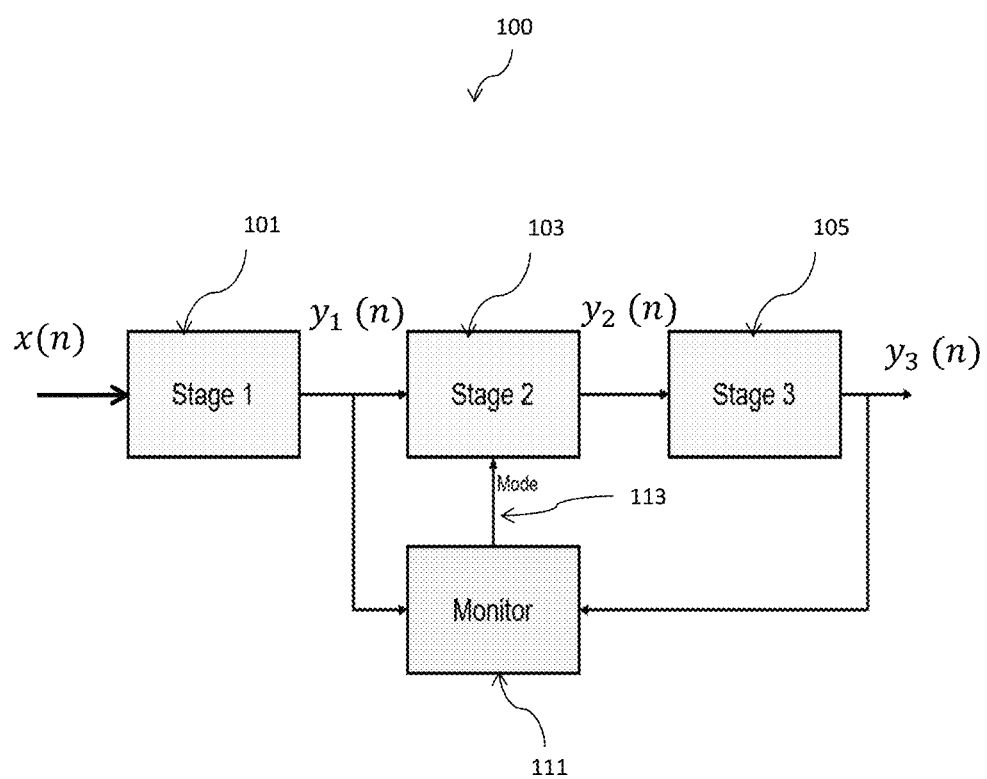
FIG. 1 is a block diagram of a reconfigurable filter network, in an embodiment.

FIG. 1 is a block diagram of a filter network 100, in an embodiment. The filter network 100 includes a filter 101 (also referred to as a first stage filter, or the first stage of the filter network 100), a filter 103 (also referred to as a second stage filter, or the second stage of the filter network 100), and a filter 105 (also referred to as a third stage filter, or the third stage of the filter network 100) coupled in series. As illustrated in FIG. 1, the input signal x(n) of the filter network 100 is sent to the input terminal of the filter 101, and the output signal $y_1(n)$ of the filter 101 is sent to the input terminal of the filter 103. The output signal $y_2(n)$ of the filter 103 is sent to the input terminal of the filter 105, and the output signal $y_3(n)$ of the filter 105 is the output of the filter network 100. In the illustrated embodiment, the filter network 100 is a digital filter network and generates an output sample $y_3(n)$ for each input sample x(n).

FIG. 1 further illustrates a monitor circuit 111, which is optional. The monitor circuit 111 may be a micro-controller, a finite-state machine, an application specific integrated circuit (ASIC), or the like. The monitor circuit 111 is configured to monitor the output $y_1(n)$ of the first stage filter 101 and the output $y_3(n)$ of the third stage filter 105 to detect a transient in the input signal x(n), and is configured to select (e.g., set) the operation mode of the filter network 100 accordingly using a mode selection signal 113. Details regarding the operation of the monitor circuit 111 are discussed hereinafter. In the example of FIG. 1, the monitor circuit 111 is part of the filter network 100. In other embodiments, the monitor circuit 111 is not part of the filter network 100. For example, the monitor circuit 111 may be external to the filter network 100, and may control the operation mode of the filter network 100 through the mode selection signal 113.

In the illustrated embodiment, the first stage filter 101 and the third stage filter 105 are infinite impulse response (IIR) filters, such as first-order IIR filters. The second stage filter 103 includes one or more reconfigurable first-order IIR filters coupled in series, details of which are discussed hereinafter. The one or more reconfigurable first-order IIR filters may operate in tracking mode or acquisition mode, depending on the mode selection signal 113 (may also be referred to as a mode control signal 113) from the monitor circuit 111. Since the second stage filter 103 is reconfigurable, the filter network 100 may also be referred to as a reconfigurable filter network. In addition, since the first stage filter 101 and the third stage filter 105 have fixed structures (e.g., not reconfigurable), and only the second stage filter 103 is reconfigurable (e.g., can operate in different modes with different equivalent filter structures), the description herein may refer to the operation mode of the filter network 100 and the operation mode of the second stage filter 103 interchangeably. For example, when the filter network 100 is said to be in tracking mode, the second stage filter 103 is also said to be in tracking mode, or vice versa.

Figure 2:
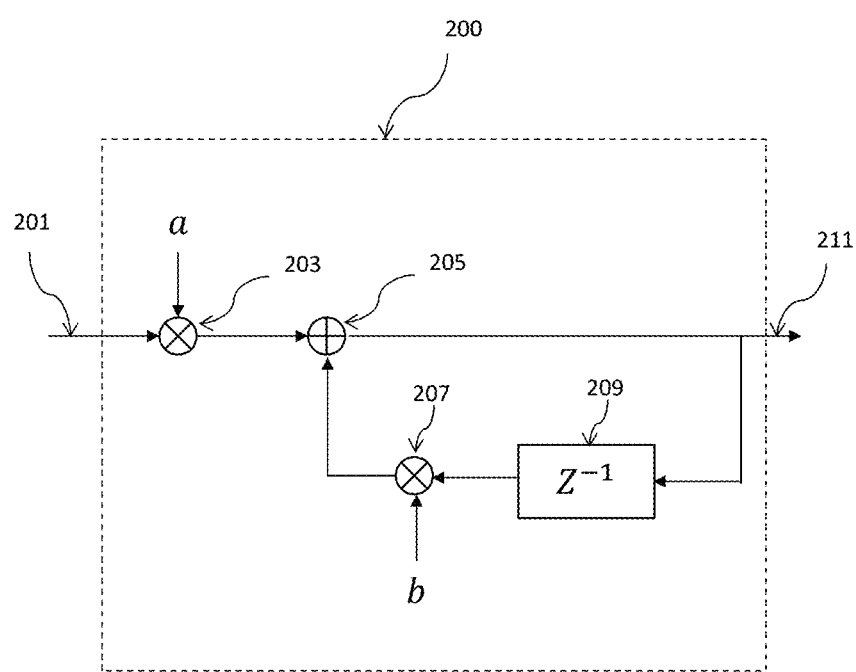
FIG. 2 is a block diagram of a first-order infinite impulse response (IIR) filter, in an embodiment.

FIG. 2 is a block diagram of a first-order infinite impulse response (IIR) filter 200, in an embodiment. First-order IIR filters have a simple structure and are easy to implement. In addition, stability of the first-order IIR filters is easily achieved by choosing the coefficients of the first-order IIR filters appropriately. The out-of-band rejection of a single first-order IIR filter, however, may not be high enough for some applications. Higher order IIR filters may achieve better out-of-band rejection, but may be more complex and expensive to implement. In addition, some types of higher order IIR filters may have stability issues. Therefore, for the filter networks 100, first-order IIR filters are concatenated (e.g., coupled in series) to achieve high out-of-band rejection while avoiding the stability issues related with some types of higher order IIR filters.

In FIG. 2, the IIR filter 200 has a memory element 209, which may also be referred to as a register or a delay element. The memory element 209 is used to save (e.g., store) the last output of the first-order IIR filter 200. The first-order IIR filter 200 also has an adder 205, a multiplier 203 and a multiplier 207. The first-order IIR filter 200 calculates a linear combination of the input data at the input terminal 201 and the stored value in the memory element 209 as the output of the first-order IIR filter 200. In particular, the input data at the input terminal 201 is multiplied with a coefficient a using the multiplier 203, the stored value in the memory element 209 is multiplied with a coefficient b using the multiplier 207, and the outputs of the multipliers 203 and 207 are then summed by the adder 205. One skilled in the art will readily appreciate that a direct-current (DC) gain G of the IIR filter 200 is G=a/(1−b). By setting the coefficients a and b appropriately, different DC gains can be achieved for the first-order IIR filter 200. For example, by setting a=1−b, a unit-gain IIR filter is formed. As another example, by setting a=½ and b=¾, the IIR filter has a DC gain of G=2.

Referring back to FIG. 1, the first stage filter 101 and the third stage filter 105 are both first-order IIF filters, such as the first-order IIR filter 200 of FIG. 2, but with their own sets of coefficients a and b, in some embodiments. For example, the first stage filter 101 may have coefficients $a_1$ and $b_1$ such that the DC gain of the first stage filter 101 is $G_1$ (see, e.g., FIG. 6). Similarly, the third stage filter 105 may have coefficients $a_3$ and $b_3$ (see, e.g., FIG. 6) such that the DC gain of the third stage filter 105 is $G_3$. The second stage filter 103 may include one or more reconfiguration first-order IIR filters 250_1, 205_2, . . . , 250_N (see, e.g., FIG. 5) coupled in series, where N is a positive integer (N≥1). The DC gains of the reconfiguration first-order IIR filters 250_1, 250_2, . . . , 250_N of the second stage filter 103 are denoted as $G_{21}$, $G_{22}$, . . . , $G_{2N}$, respectively, and the DC gain $G_2$ of the second stage filter 103 is determined by $G_2=G_{21} \times G_{22} \ldots \times G_{2N}$. Note than unlike the second stage filter 103, the first stage filter 101 and the third stage filter 105 have fixed structure (e.g., fixed first-order IIR filter) and functions as low-pass filters regardless of the operation mode of the filter network 100. As will be discussed in more detail below, the second stage filter 103 is reconfigurable and functions as a low-pass filter (e.g., having an equivalent structure of N first-order IIR filter coupled in series) in tracking mode, and is bypassed (e.g., having an equivalent structure of an amplifier with a pre-determined gain) in acquisition mode.

Figure 3:
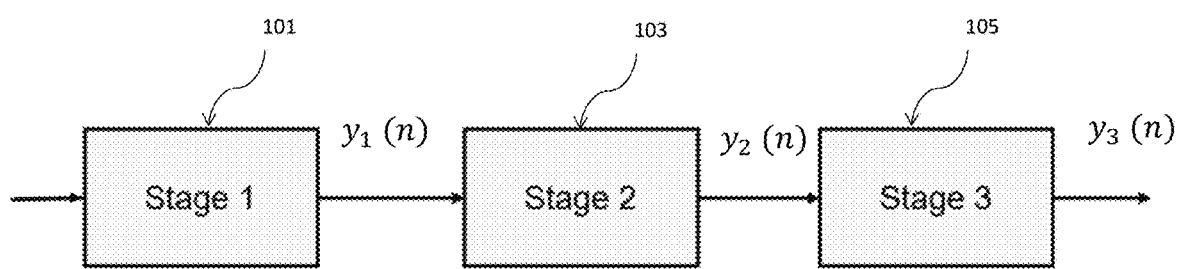
FIG. 3 is an equivalent block diagram of the reconfigurable filter network of FIG. 1 in tracking mode, in an embodiment.
Figure 6:
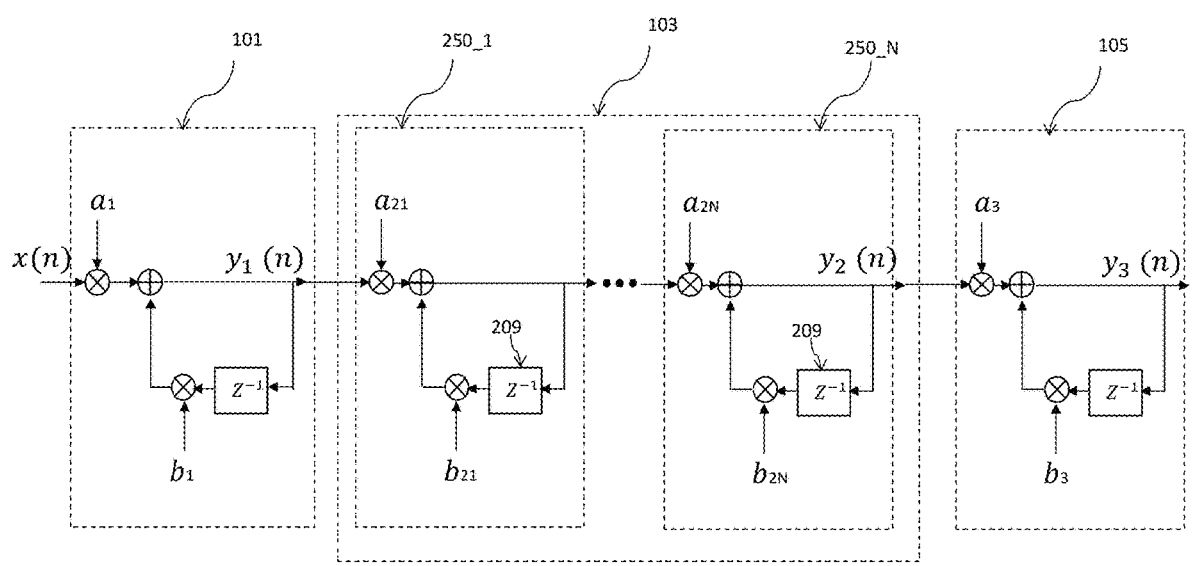
FIG. 6 illustrates an equivalent block diagram of the reconfigurable filter network of FIG. 1 with the second stage filter of FIG. 5 in tracking mode, in an embodiment.

When no transient is detected in the input signal x(n), the input signal x(n) is substantially stable (e.g., a constant signal, or a slow changing signal), the filter network 100 operates in the tracking mode (also referred to as low noise mode). In tracking mode, all of the filters 101/103/105 in the filter network 100 function as, e.g., low-pass filters to achieve a target level of out-of-band rejection and produce accurate filter output. FIG. 3 illustrates a block diagram of the filter network 100 in tracking mode, where first stage filters 101 and the third stage filter 105 are first-order IIR filters, and the second stage filter 103 includes one or more first-order IIR filters coupled in series. FIG. 6 shows the equivalent structure of the filters of the filter networks 100 in tracking mode, details of which are discussed hereinafter. One skilled in the art will appreciate that for a stable (e.g., constant) input signal x(n), the outputs $y_1(n)$, $y_2(n)$, and $y_3(n)$ of the filters 101, 103, 105, after the filter network 100 settles down (e.g., converges), are substantially the same, with minor differences caused by, e.g., different noise components in each of the outputs.

Although each of the first-order IIR filter has a relatively short impulse response and relatively quick settling time (or fast convergence speed), a concatenation of the plurality of first-order IIR filters may have a long impulse response and slow settling time. When there is a transient in the input signal x(n), e.g., when x(n) suddenly changes from a first value to a second value with a large difference in between, such as in a step change situation, it may take a long time for the filter network 100 configured in tracking mode to converge (e.g., settle down) to the final value.

Figure 4:
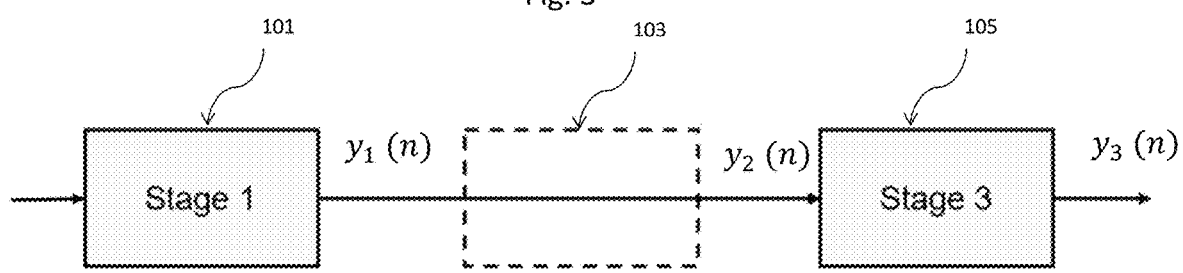
FIG. 4 is an equivalent block diagram of the reconfigurable filter network of FIG. 1 in acquisition mode, in an embodiment.
Figure 7:
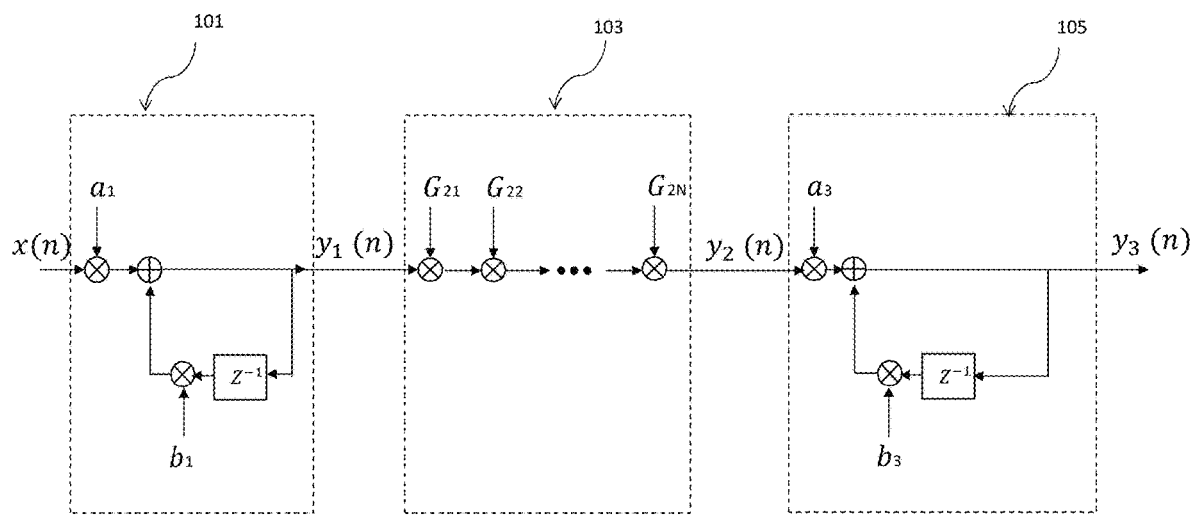
FIG. 7 illustrates an equivalent block diagram of the reconfigurable filter network of FIG. 1 with the second stage filter of FIG. 5 in acquisition mode, in an embodiment.

In the illustrated embodiment, to reduce the settling time, the filter network 100 is set to operate in an acquisition mode (also referred to as the fast settling mode) when a transient in the input signal x(n) is detected. In the acquisition mode, the second stage filter 103 is bypassed. FIG. 4 illustrates a block diagram of the filters of the filter network 100 in acquisition mode, where the second stage filter 103 is illustrated by a direct-pass signal path. FIG. 7 shows an example of an equivalent structure of the filters of the filter networks 100 in acquisition mode, details of which are discussed hereinafter. One skilled in the art will appreciate that being "bypassed" here means that the second stage filter 103 no longer functions as a low-pass IIR filter, and instead, functions as an amplifier with a pre-determined gain (e.g., a unit gain, or a non-unit gain). In other words, in acquisition mode, $y_2(n)=y_1(n) \times G_2$, in some embodiments.

Referring to FIG. 4, in acquisition mode, the first stage filter 101, which is a first-order IIR filter, has a relatively fast settling time and responds to a transient in the input signal x(n) to quickly determine a rough estimate $y_1(n)$ of the final settled value (e.g., the final value after convergence of filter output). The rough estimate $y_1(n)$ may have noise levels that are above the target noise level allowed as the final settled value. Since the second stage filter 103 is bypassed, the rough estimate $y_1(n)$ is quickly propagated through (e.g., filtered by) the third stage filter 105 and outputted as the output signal $y_3(n)$. The third stage filter 105 rejects (e.g., filters out) more out-of-band noise. In addition, the third stage filter 105, by virtue of its low-pass filtering function, ensures the smoothness of the output signal $y_3(n)$ when the filter network 100 switches between the acquisition mode and the tracking mode. Once the output $y_3(n)$ of the third stage filter 105 approaches the final settled value, the monitor circuit 111 detects that there is no more transient in the input signal x(n), and instructs the filter network 100 to enter the tracking mode. The additional filtering of the second stage filter 103 in the tracking mode reduces the noise level in the output signal $y_3(n)$ below the target noise level to produce accurate output.

Operation of the monitor circuit 111 (see FIG. 1) is now discussed. The monitor circuit 111 is configured to monitor the output $y_1(n)$ of the first stage filter 101 and the output $y_3(n)$ of the third stage filter 105 to detect the transient in the input signal x(n), and is configured to select (e.g., set) the operation mode of the filter network 100 accordingly using the mode selection signal 113.

In some embodiments, the monitor circuit 111 sets the filter network 100 to operate in the tracking mode initially (e.g., after power up, or after a reset). The monitor circuit 111 then monitors the output $y_1(n)$ of the first stage filter 101 and the output $y_3(n)$ of the third stage filter 105. For example, the monitor circuit 111 may compute a difference between a scaled version of the output of the first stage filter 101 (e.g., $y_1(n) \times G_2 \times G_3$, where $G_2$ and $G_3$ are the DC gains of the second stage filter 103 and the third stage filter 105, respectively) and the output $y_3(n)$ of the third stage filter 105. If the computed difference (e.g., the absolute value of the computed difference) is larger than a pre-determined threshold, the monitor circuit 111 may determine that a transient in the input signal x(n) is detected. In response to detection of the transient in x(n), the monitor circuit 111 sets the filter network 100 in acquisition mode. The monitor circuit 111 keeps monitoring the output $y_1(n)$ of the first stage filter 101 and the output $y_3(n)$ of the third stage filter 105. If the computed difference (e.g., the absolute value of the computed difference) drops below the pre-determined threshold, the monitor circuit 111 may determine that the transient is over and may set the filter network 100 in tracking mode.

Figure 5:
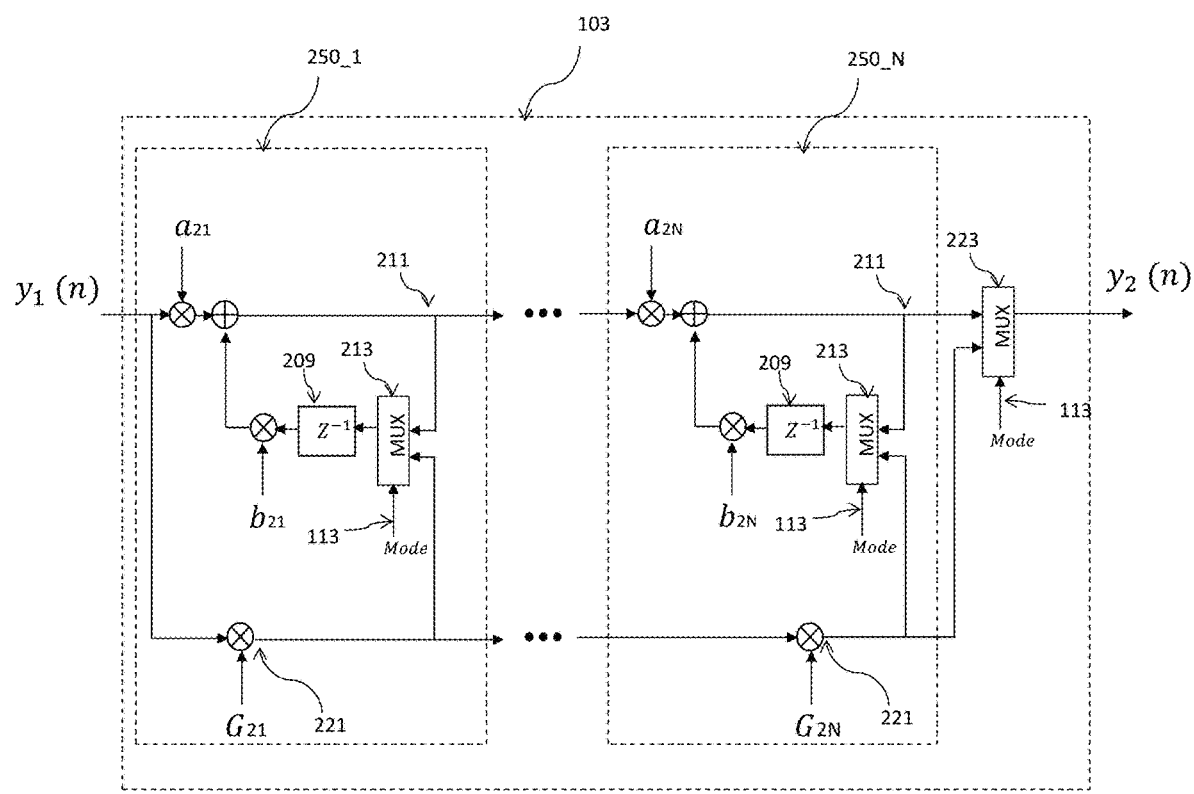
FIG. 5 illustrates a block diagram of a second stage filter of the reconfigurable filter network of FIG. 1, in an embodiment.

Various embodiments of the second stage filter 103 and the corresponding structure for the filter network 100 in different modes are discussed hereinafter. FIG. 5 is an example block diagram of the second stage filter 103. The second stage filter 103 of FIG. 5 is a reconfigurable filter (e.g., can operate in tracking mode and acquisition mode), and includes N reconfigurable filters 250_1, 250_2, . . . , 250_N, where N is an integer equal to or larger than 1. For ease of discussion, the reconfigurable filters 250_1, 250_2, . . . , 250_N may be collectively referred to as reconfigurable filters 250, and the notation of 250_k may be used to refer to any of the reconfigurable filters 250. As illustrated in FIG. 5, each reconfigurable filter 250_k has its own set of coefficients $a_{2k}$ and $b_{2k}$, and its respective DC gain $G_{2k}=a_{2k}/(1-b_{2k})$, where k=1, 2, . . . , N.

For embodiments where there are more than one reconfigurable filters 250 in the second stage filter 103, the reconfigurable filters 250 are connected in series, as illustrated in FIG. 5. Each of the reconfigurable filters 250 has a structure similar to the first-order IIR filter 200 of FIG. 2, but compared with the first-order IIR filter 200 of FIG. 2, each of the reconfigurable filters 250 has an additional multiplexer (MUX) 213 and an additional multiplier 221 (may also be referred to as an amplifier). The gain of the multiplier 221 in each reconfigurable filter 250_k is set to be the DC gain $G_{2k}$ of the reconfigurable filter 250_k. For example, the reconfigurable filter 250_1 has coefficients $a_{21}$ and $b_{21}$ and a DC gain $G_{21}=a_{21}/(1-b_{21})$, and the multiplier 221 of the reconfigurable filter 250_1 has a gain equal to the DC gain $G_{21}$.

For each reconfigurable filter 250_k, a first input of the MUX 213 is coupled to the output terminal 211, a second input of the MUX 213 is coupled to the output of the multiplier 221, and an output of the MUX 213 is coupled to the input of the memory element 209. The output of the MUX 213 is controlled by the mode control signal 113 from the monitor circuit 111. FIG. 5 further illustrates a MUX 223 between the last reconfigurable filter 250_N and the output terminal of the second stage filter 103. A first input of the MUX 223 is coupled to the output terminal 211 of the reconfigurable filter 250N, and a second input of the MUX 223 is coupled to the output of the multiplier 221 of the reconfigurable filter 250_N. The mode control signal 113 selects the output of the MUX 223.

As illustrated in FIG. 5, the output of each reconfigurable filter 250_k (e.g., at the output terminal 211) is coupled to the input terminal of a subsequent reconfigurable filter 250_(k+1). In addition, the output of the multiplier 221 of each reconfigurable filter 250_k is coupled to the input of the multiplier 221 of a subsequent reconfigurable filter 250_(k+1). In some embodiments, the DC gain of the reconfigurable filter 250_k is designed to be a value that can be efficiently implemented in hardware, such as a power of two, in which case the multiplier 221 may be replaced by a simple bit-shifting operation. For example, a multiplier 221 with gain of a power of two (e.g., $2^m$) may be implemented by shifting the digital value (e.g., digital bits) of the input to the left by m bits.

Still referring to FIG. 5, for each reconfigurable filters 250_k, the MUX 213 is controlled by the mode control signal 113 from the monitor circuit 111 (see FIG. 1). The mode control signal 113 may be a one-bit digital signal (e.g., having a "0" or "1" value). Each of the two values of the mode control signal 113 selects a respective input signal of the MUX 213 as the output of the MUX 213. In the illustrated embodiment, when the mode control signal 113 indicates the tracking mode, the signal at the output terminal 211 is selected as the output of the MUX 213 and is sent to the input terminal of the memory element 209; the signal at the output terminal 211 of the reconfigurable filter 250_N is sent out as the output $y_2(n)$ of the second stage filter 103; and the filter network 100 enters the tracking mode.

FIG. 6 is a block diagram showing the equivalent structure of the filters of the filter network 100 having the second stage filter 103 of FIG. 5 in tracking mode. As illustrated in FIG. 6, the filter network 100 includes the first stage filter 101 (a first-order IIR filter), the second stage filter 103 (which includes N first-order IIR filters coupled in series), and the third stage filter 105 (a first-order IIR filter). Therefore, the filter network 100 has an equivalent structure of N+2 first-order IIR filters coupled in series, where N is a positive integer (N≥1). As illustrated in FIG. 6, in tracking mode, the N+2 first-order IIR filters are coupled in series to provide excellent out-of-band rejection to reduce noise components in the final output signal $y_3(n)$.

As illustrated in FIG. 6, in tracking mode, for each input sample of the filter network 100 (e.g., for each input sample at the input terminal of the first stage filter 101), the memory element 209 of the reconfigurable filter 250_k is updated with a value, which value is determined by the output of a preceding filter and by a previous output value of the reconfigurable filter 250_k that is stored in the memory element 209. The preceding filter is the first stage filter 101 for the reconfigurable filter 250_1, or is the reconfiguration filter 250_(k−1) for the reconfigurable filter 250_k (for k≥2). In particular, the memory element 209 of the reconfigurable filter 250_k is updated with a value that is a linear combination of the output of the preceding filter and the previous output value of the reconfigurable filter 250_k.

Referring back to FIG. 5, when the mode selection signal 113 indicates the acquisition mode, the output of the multiplier 221 of each reconfigurable filter 250_k is selected as the output of the respective MUX 213 and is sent to the input terminal of the respective memory element 209, the output of the multiplier 221 of the reconfigurable filter 250_N is sent out as the output $y_2(n)$ of the second stage filter 103, and the filter network 100 enters the acquisition mode.

In the example of FIG. 5, the output of the multiplier 221 of the reconfigurable filter 250_1 is a scaled version of the output $y_1(n)$ of the first stage filter 101. In particular, the output of the multiplier 221 of the reconfigurable filter 250_1 is $y_1(n)$ multiplied with the DC gain $G_{21}$ of the reconfigurable filter 250_1. The output of the multiplier 221 of the reconfigurable filter 250_k, where k≥2, is the output of the multiplier 221 of the preceding reconfigurable filter 250_(k−1) multiplied with the DC gain $G_{2k}$ of the reconfigurable filter 250_k. In the illustrated embodiment, for each input sample of the filter network 100, the output of the multiplier 221 is loaded into a respective memory element 209. In other embodiments, loading of the output of the multiplier 221 into the respective memory element 209 is performed only once, at the end of the acquisition mode and before switching to tracking mode. For example, once the monitor circuit 111 detects that transient in the input signal no longer exists (e.g., the computed difference between the scaled version of the output of the first stage filter 101 and the output of the third stage filter 103 is below the predetermined threshold), the output of the multiplier 221 in each reconfigurable filter 250_k is loaded into the respective memory element 209, before the filter network 100 switches into tracking mode.

FIG. 7 illustrates the equivalent structure of the filters of filter network 100 with the second stage filter 103 of FIG. 5 in acquisition mode. As illustrated in FIG. 7, in the acquisition mode, the IIR filtering function of the second stage filter 103 is bypassed, and the second stage filter 103 functions as an amplifier having a gain $G_2$, where $G_2=G_{21} \times G_{22} \times \ldots G_{2N}$. In other words, in acquisition mode, each reconfigurable filter 250_k no long functions as an IIR low-pass filter, and instead, each reconfigurable filter 250_k simply amplifies its input signal with its DC gain and outputs the amplified signal as its output. This allows the rough estimate $y_1(n)$ of the final settled value to quickly propagate through the third stage filter 105, thereby reducing the settling time of the filter network 100 when the input signal x(n) has a transient. In other embodiments, the second stage filter 103 is bypassed by a parallel signal path (e.g., a signal path with a fixed gain) with an appropriate gain (e.g., a gain that equals to $G_2$), and the second stage filter 103 are not operational during the acquisition mode. For example, a digital clock signal to the second stage filter 103 may be disabled, such that the second stage filter 103 consumes less or no power during the acquisition mode. At the end of the acquisition mode (e.g., at the last clock cycle of the acquisition mode), scaled versions of the output of the first stage filter 101 are loaded into respective delay elements 209 in preparation for switching into the tracking mode. Once the acquisition mode ends and the tracking mode starts, the parallel bypass signal path is removed (e.g., disconnected by a switch), the digital clock signal of the second stage filter 103 is enabled, and the second stage filter 103 functions as an IIR filter.

Note that in the acquisition mode, the output of the multiplier 221 of each reconfigurable filter 250_$k$ is loaded into (e.g., copied into, or stored into) the corresponding memory element 209. Although for the example of FIG. 5, the stored value in the memory element 209 does not affect the output of the second stage filter 103 in acquisition mode, the stored value in each memory element 209 represents a rough estimate of the final settled output value for each reconfigurable filter 250_$k$. Therefore, loading the output of the multiplier 221 into the corresponding memory element 209 allows faster convergence (shortened settling time) when the filter network 110 switches from acquisition mode into tracking mode, because when the transient stops and the filter network 100 exits the acquisition mode, the output of each reconfigurable filter 250_$k$ is already close to the final settled value.

Figure 8:
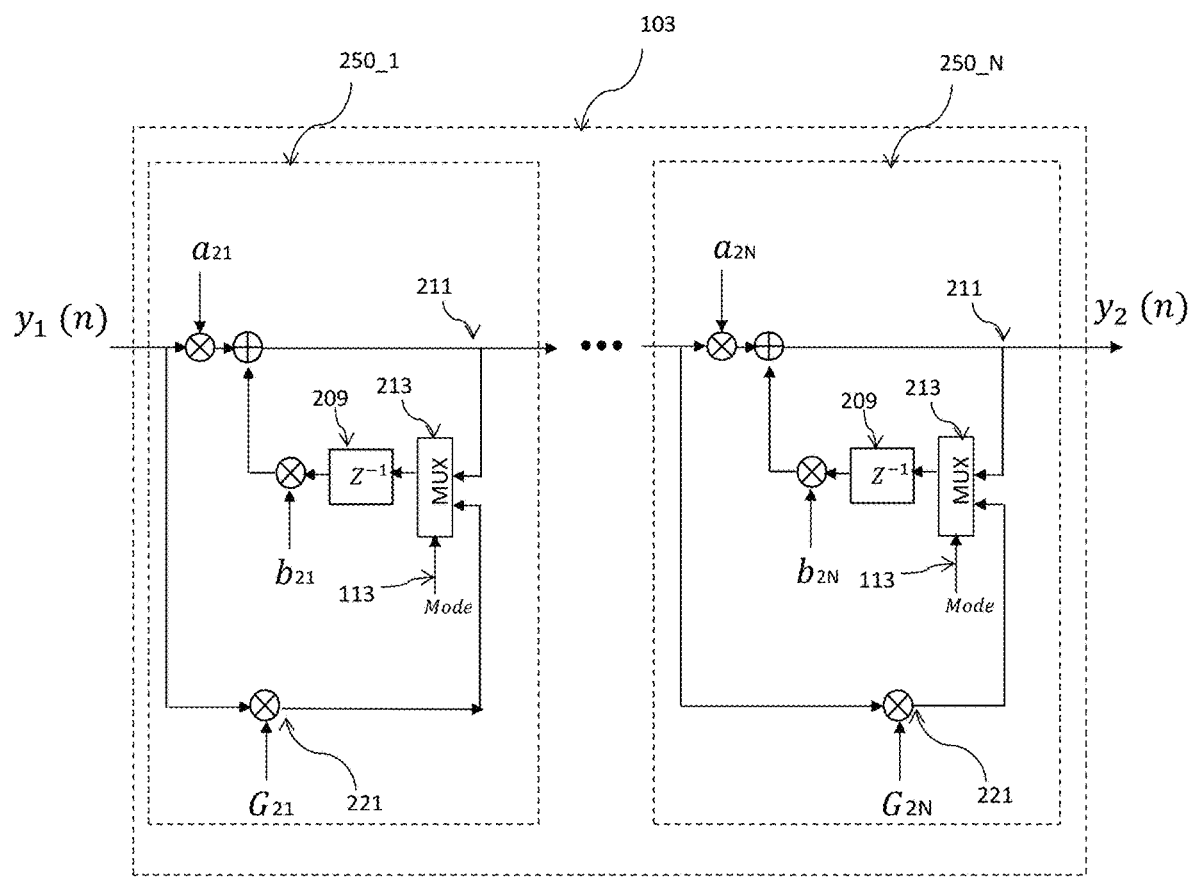
FIG. 8 illustrates a block diagram of a second stage filter of the reconfigurable filter network of FIG. 1, in another embodiment.

FIG. 8 is another example block diagram of the second stage filter 103. The second stage filter 103 in FIG. 8 is similar to that in FIG. 5, but without the MUX 223. In addition, the output of the multiplier 221 in each reconfigurable filter 250_$k$ is no longer sent to the input terminal of the multiplier 221 of a subsequent reconfigurable filter 250_$(k+1)$. Control of the MUX 213 in FIG. 8 is the same as that in FIG. 5. In particular, in tracking mode, the signal at the output terminal 211 is selected as the output of the MUX 213, and in acquisition mode, the output of the multiplier 221 is selected as the output of the MUX 213.

One skilled in the art will readily appreciate that, in tracking mode, the equivalent structure of the filter network 100 with the second stage filter 103 of FIG. 8 is the same as the structure illustrated in FIG. 6. In acquisition mode, each reconfigurable filter 250_$k$ of FIG. 8 is equivalent to (e.g., functions as) a finite impulse response (FIR) filter with a DC gain of $G_{2k}$. Since each of the equivalent FIR filters has a short impulse response (e.g., two data samples long), the settling time of the second stage filter 103 of FIG. 8 in acquisition mode is still short, and therefore, offer shortened settling time for the filter network 100.

Figure 9:
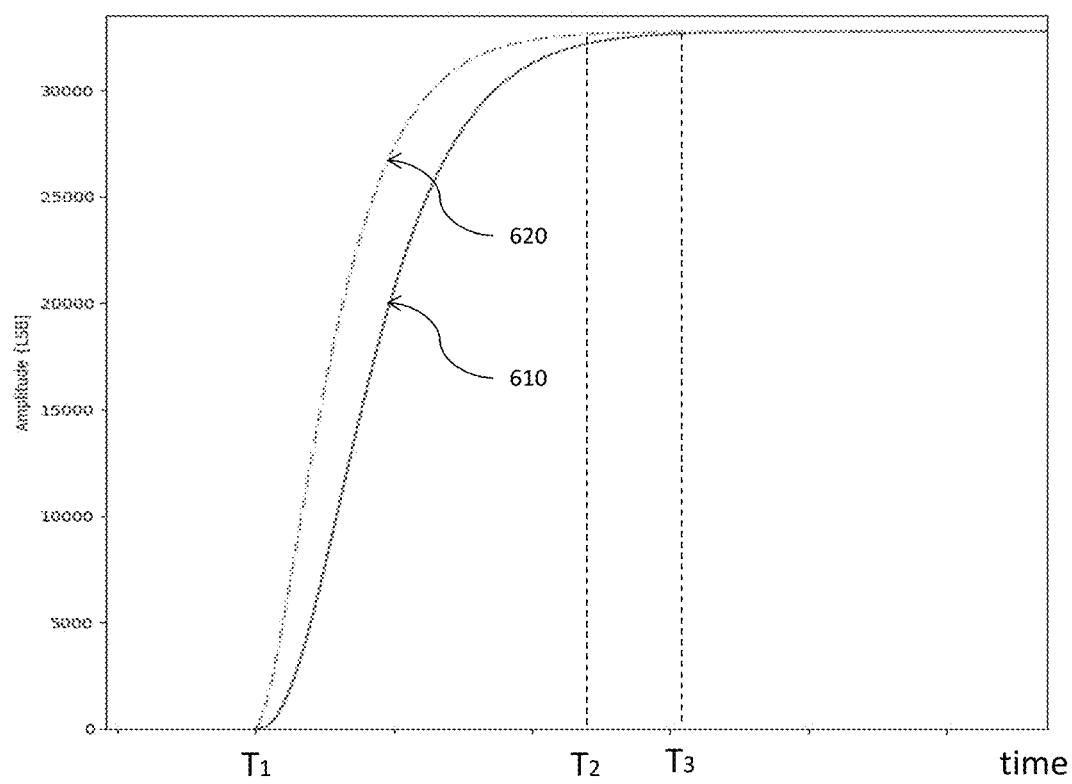
FIG. 9 illustrates an example of the time response of the reconfigurable filter network of FIG. 1.

FIG. 9 illustrates an example of the time response of the filter network 100 of FIG. 1. The X-axis in FIG. 9 represents time, and the Y-axis represents the amplitude of the output signal $y_3(n)$. Curve 620 shows the response of the filter network 100 in response to a transient in the input signal $x(n)$, where the input signal $x(n)$ has a constant value and the transient is a step function (e.g., $A \times u(t-T_1)$). In other words, a large step increase in the input signal $x(n)$ is introduced at time $T_1$. For the time response shown by the curve 620, the filter network 100 enters acquisition mode at time $T_1$ after the monitor circuit 111 detects the transient, and as a result, the time response quickly settles down (e.g. converges) to the final settled value at time $T_2$. For comparison, curve 610 shows the response of the filter network 100 to the same transient when the filter network 100 operates in tracking mode at all times (e.g., when the mode selection signal 113 is set to tracking mode at all times). It is seen from FIG. 9 that without using the acquisition mode, it takes longer (e.g., at time $T_3$) for the filter network 100 to settle down at the final settled value. FIG. 9 illustrates the advantage (e.g., shortened settling time) of the reconfigurable filter network 100 working in different modes based on the mode selection signal 113.

Figure 10:
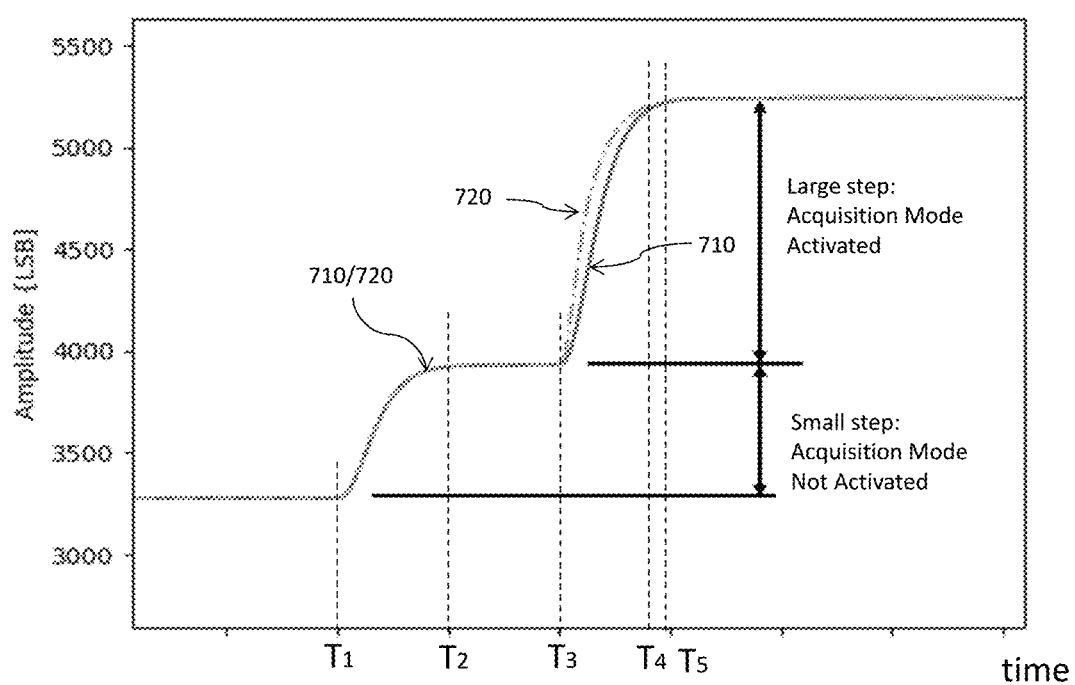
FIG. 10 illustrates another example of the time response of the reconfigurable filter network of FIG. 1.
Figure 11:
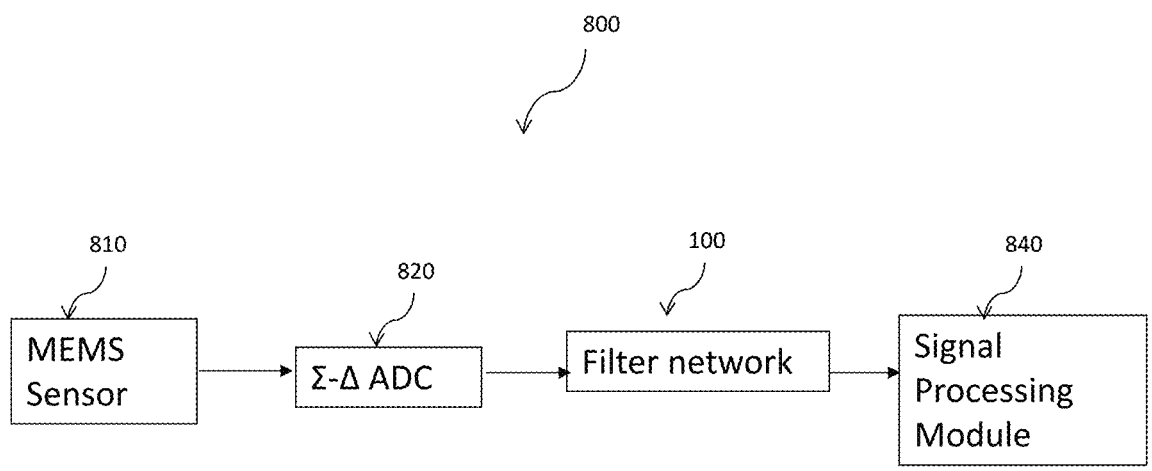
FIG. 11 is a block diagram of a system comprising a reconfigurable filter network, in an embodiment.

FIG. 10 illustrates another example of the time response of the filter network 100 of FIG. 1. The X-axis in FIG. 10 represents time, and the Y-axis represents the amplitude of the output signal $y_3(n)$. Curve 720 shows the time response of the filter network 100 in response to a first step increase and a second step increase in the input signal $x(n)$, where the input signal $x(n)$ has a constant value, the first step increase is a step function $a \times u(t-T_1)$, and the second step increase is another step function $b \times u(t-T_3)$). In the example of FIG. 10, the amplitude a of the first step increase is smaller than a pre-determined threshold, such that the monitor circuit 111 does not detect a transient when the first step increase is applied at time $T_1$, and the filter network 100 stays in tracking mode from time $T_1$ to time $T_3$. The amplitude b of the second step increase is larger than the pre-determined threshold, such that the monitor circuit 111 detects a transient when the second step increase is applied at time $T_3$, and therefore, the filter network 100 switches into acquisition mode at time $T_3$. The time response settles down at time $T_4$.

For comparison, curve 710 shows the time response of the filter network 100 when the filter network 100 is forced to operate in the tracking mode at all times. It is seen that the curves 710 and 720 overlaps with each other until time $T_3$. The curve 720 shows a faster convergence speed (shortened settling time) after time $T_3$, due to the activation of the acquisition mode. As a result, the curve 720 reaches the final settled value at time $T_4$. The curve 710 reaches the final settled value at time $T_5$ after time $T_4$, due to slower response of the tracking mode. In both FIGS. 9 and 10, the filter network 100 output $y_3(n)$ is smooth regardless of whether the filter network is switching between different operation modes, this illustrates the advantage of having the third stage filter 105 after the second stage filter 103, which ensures a smooth output by virtue of its low-pass filtering function.

FIG. 1 is a block diagram of a system 800 comprising a reconfigurable filter, in an embodiment. The system 800 includes a sensor 810, an analog-to-digital converter (ADC) 820, a filter network 100, and an optional signal processing module 840. The sensor 810 may be a microelectromechanical systems (MEMS) sensor, such as a tire pressure sensor. The ADC 820 may be any suitable ADC, such as a sigma-delta ADC. The filter network 100 is the filter network 100 of FIG. 1. The signal processing module 840, which is optional, may include one or more functional blocks to process the output of the reconfigurable filter 100. The functional modules (e.g., 810, 820, 100, and 840), or portions of them, may be integrated into an integrated circuit (IC) device to provide a compact semiconductor device with enhanced functionalities.

In the system 800, the output of the sensor 810 is converted into digital data by the ADC 820. The output of the ADC 820 is filtered by the filter network 100, e.g., to remove out-of-band noises and to provide accurate ADC output. The filtered ADC data is then sent to other modules (e.g., 840) for further processing and analysis. For certain applications, such as tire pressure monitoring systems, the system 800 is well suited and provide a low-cost, high-performance solution. This is because in case of a transient in the input signal (e.g., a sudden change in the tire pressure due to leakage or puncture) of the filter network 100, it may be advantageous for the filter network 100 to produce an accurate estimate of the final settled value (e.g., final tire pressure) in a short period of time, and the applications may not care about the transient response before the output of the filter network 100 settles down. In other words, the application may care more about the DC contents of the sensor data than high-frequency contents of the sensor data. The filter network 100, by switching to acquisition mode in response to detection of a transient it its input signal, allows shortened settling time while still maintains excellent out-of-band rejection during tracking mode. The structure of the filter network 100 allows for lost-cost implementation and is well suited for integration into a low-cost IC device.

FIG. 12 is a flow diagram of a method of operating a filter network, in an embodiment. It should be understood that the embodiment method shown in FIG. 12 is merely an example of many possible embodiment methods. One of ordinary skill in the art would recognize many variations, alternatives, and modifications. For example, various steps as illustrated in FIG. 12 may be added, removed, replaced, rearranged and repeated.

Referring to FIG. 12, at step 1010, an input signal and an output signal of the filter network are monitored. The filter network includes a first infinite impulse response (IIR) filter, a second IIR filter, and a third IIR filter coupled in series, with the second IIR filter coupled between the first IIR filter and the third IIR filter, where the first IIR filter, the second IIR filter, and the third IIR filter are first-order IIR filters. At step 1020, a transient in the input signal of the filter network is detected. At step 1030, in response to detecting the transient, the second IIR filter is operated in an acquisition mode, wherein operating the second IIR filter in the acquisition mode comprises: for each input sample of the filter network, loading a scaled value of an output of the first IIR filter into a register of the second IIR filter.

Example embodiments of the present invention are summarized here. Other embodiments can also be understood from the entirety of the specification and the claims filed herein.

Example 1. In an embodiment, a filter circuit includes: a first stage comprising a first infinite impulse response (IIR) filter; a third stage comprising a third IIR filter; and a second stage interposed between the first stage and the third stage, the second stage comprising a second IIR filter, wherein an output terminal of the first IIR filter is coupled to an input terminal of the second IIR filter, and an output terminal of the second IIR filter is coupled to an input terminal of the third IIR filter, wherein the second stage of the filter circuit is configured to operate in an acquisition mode when a transient is detected in an input signal to the first IIR filter, wherein during the acquisition mode, the second stage of the filter circuit is bypassed.

Example 2. The filter circuit of Example 1, wherein the first IIR filter, the second IIR filter, and the third IIR filter are first-order IIR filters.

Example 3. The filter circuit of Example 2, wherein during the acquisition mode, a first scaled version of an output of the first IIR filter is loaded into a register of the second IIR filter.

Example 4. The filter circuit of Example 3, wherein the first scaled version of the output of the first IIR filter is a value equal to the output of the first IIR filter multiplied with a direct current (DC) gain of the second IIR filter.

Example 5. The filter circuit of Example 4, wherein a time response of the filter circuit is faster when the second stage operates in the acquisition mode than when the second stage operates in a tracking mode, wherein in the tracking mode, the second stage functions as a low-pass filter.

Example 6. The filter circuit of Example 4, wherein the second stage further comprises a fourth IIR filter, wherein the fourth IIR filter is coupled in series between the second IIR filter and the third IIR filter, wherein during the acquisition mode, a second scaled version of the output of the first IIR filter is loaded into a register of the fourth IIR filter.

Example 7. The filter circuit of Example 6, wherein the second scaled version of the output of the first IIR filter is a value equal to the first scaled version of the output of the first IIR filter multiplied with a DC gain of the fourth IIR filter.

Example 8. The filter circuit of Example 1, further comprising a monitoring circuit coupled to the first stage, the second stage, and the third stage, wherein the monitoring circuit is configured to: detect the transient in the input signal to the first IIR filter; and in response to detecting the transient, set the second stage of the filter circuit into the acquisition mode.

Example 9. The filter circuit of Example 8, wherein the monitoring circuit is configured to detect the transient by: computing a difference between an output of the third IIR filter and a scaled version of an output of the first IIR filter; and declaring detection of the transient when the computed difference is larger than a pre-determined threshold.

Example 10. The filter circuit of Example 9, wherein the scaled version of the output of the first IIR filter is a value equal to the output of the first IIR filter multiplied with a combined DC gain, wherein the combined DC gain is equal to a multiplication of DC gains of all filters disposed between the first IIR filter and an output terminal of the third IIR filter.

Example 11. The filter circuit of Example 8, wherein the monitoring circuit is further configured to: after setting the second stage of the filter circuit into the acquisition mode, detect that the transient is over; and in response to detecting that the transient is over, set the second stage of the filter circuit in a tracking mode different from the acquisition mode, wherein during the tracking mode, for each input sample at the input terminal of the first IIR filter, a register of the second IIR filter is updated with a value determined by an output of the first IIR filter and by a previous output value of the second IIR filter stored in the register of the second IIR filter.

Example 12. The filter circuit of Example 1, wherein the second stage of the filter circuit is configured to operate in a tracking mode when no transient is detected in the input signal to the first IIR filter, wherein during the tracking mode, for each input sample at the input terminal of the first IIR filter, a register of the second IIR filter is updated with a value determined by an output of the first IIR filter and by a previous output value of the second IIR filter stored in the register of the second IIR filter.

Example 13. The filter circuit of Example 12, wherein during the tracking mode, for each input sample at the input terminal of the first IIR filter, the register of the second IIR filter is updated with a value equal to a linear combination of the output of the first IIR filter and the previous output value of the second IIR filter.

Example 14. In an embodiment, a system includes: a microelectromechanical systems (MEMS) sensor and a filter network comprising: a first infinite impulse response (IIR) filter, an input terminal of the first IIR filter coupled to an output terminal of the MEMS sensor; a third IIR filter, an output terminal of the third IIR filter coupled to an output terminal of the filter network; and a second IIR filter coupled between the first IIR filter and the third IIR filter, wherein the second IIR filter is configured to operate in a first mode or a second mode, wherein the filter network has a first convergence speed when the second IIR filter operates in the first mode, and the filter network has a second convergence speed slower than the first convergence speed when the second IIR filter operates in the second mode. The system further includes a monitor circuit coupled to the filter network, wherein the monitor circuit is configured to: detect a transient in an input signal at the input terminal of the first IIR filter; and set the second IIR filter to operate in the first mode in response to detecting the transient.

Example 15. The system of Example 14, wherein the monitor circuit is further configured to set the second IIR filter to operate in the second mode when no transient in the input signal at the input terminal of the first IIR filter is detected.

Example 16. The system of Example 14, wherein the first IIR filter, the second IIR filter, and the third IIR filter are first-order IIR filters.

Example 17. The system of Example 16, wherein in the first mode, for each input sample of the filter network, a register of the second IIR filter is loaded with a value that is a scaled version of an output of the first IIR filter.

Example 18. The system of Example 17, wherein in the second mode, for each input sample of the filter network, the register of the second IIR filter is updated with a value determined by an output of the first IIR filter and by a previous output of the second IIR filter.

Example 19. In an embodiment, a filter network includes a first infinite impulse response (IIR) filter, a second IIR filter, and a third IIR filter coupled in series, wherein the second IIR filter is coupled between the first IIR filter and the third IIR filter, wherein the first IIR filter, the second IIR filter, and the third IIR filter are first-order IIR filters. A method of operating the filter network includes: monitoring an input signal and an output signal of the filter network; detecting a transient in the input signal of the filter network; and in response to detecting the transient, operating the second IIR filter in an acquisition mode, wherein operating the second IIR filter in the acquisition mode comprises: for each input sample of the filter network, loading a scaled value of an output of the first IIR filter into a register of the second IIR filter.

Example 20. The method of Example 19, wherein the scaled value is computed by multiplying the output of the first IIR filter with a gain of the second IIR filter.

Example 21. The method of Example 19, further comprising operating the second IIR filter in a tracking mode when no transient is detected, wherein in the tracking mode, for each input sample of the filter network, the register of the second IIR filter is updated with a value determined by the output of the first IIR filter and by a previous output of the second IIR filter While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A filter circuit comprising:
a first stage comprising a first infinite impulse response (IIR) filter;
a third stage comprising a third IIR filter;
a second stage interposed between the first stage and the third stage, the second stage comprising a second IIR filter, wherein an output terminal of the first IIR filter is coupled to an input terminal of the second IIR filter, and an output terminal of the second IIR filter is coupled to an input terminal of the third IIR filter, wherein the second stage of the filter circuit is configured to operate in an acquisition mode when a transient is detected in an input signal to the first IIR filter, wherein during the acquisition mode, the second stage of the filter circuit is bypassed; and
a monitoring circuit coupled to the first stage, the second stage, and the third stage, wherein the monitoring circuit is configured to:
compute a difference between an output of the third IIR filter and a scaled version of an output of the first IIR filter;
declare detection of the transient in the input signal to the first IIR filter when the computed difference is larger than a pre-determined threshold; and
in response to the detection of the transient, set the second stage of the filter circuit into the acquisition mode.

2. The filter circuit of claim 1, wherein the first IIR filter, the second IIR filter, and the third IIR filter are first-order IIR filters.

3. The filter circuit of claim 2, wherein during the acquisition mode, a first scaled version of an output of the first IIR filter is loaded into a register of the second IIR filter.

4. The filter circuit of claim 3, wherein the first scaled version of the output of the first IIR filter is a value equal to the output of the first IIR filter multiplied with a direct current (DC) gain of the second IIR filter.

5. The filter circuit of claim 4, wherein a time response of the filter circuit is faster when the second stage operates in the acquisition mode than when the second stage operates in a tracking mode, wherein in the tracking mode, the second stage functions as a low-pass filter.

6. The filter circuit of claim 4, wherein the second stage further comprises a fourth IIR filter, wherein the fourth IIR filter is coupled in series between the second IIR filter and the third IIR filter, wherein during the acquisition mode, a second scaled version of the output of the first IIR filter is loaded into a register of the fourth IIR filter.

7. The filter circuit of claim 6, wherein the second scaled version of the output of the first IIR filter is a value equal to the first scaled version of the output of the first IIR filter multiplied with a DC gain of the fourth IIR filter.

8. The filter circuit of claim 1, wherein the scaled version of the output of the first IIR filter is a value equal to the output of the first IIR filter multiplied with a combined DC gain, wherein the combined DC gain is equal to a multiplication of DC gains of all filters disposed between the first IIR filter and an output terminal of the third IIR filter.

9. The filter circuit of claim 1, wherein the monitoring circuit is further configured to:
after setting the second stage of the filter circuit into the acquisition mode, detect that the transient is over; and
in response to detecting that the transient is over, set the second stage of the filter circuit in a tracking mode different from the acquisition mode, wherein during the tracking mode, for each input sample at the input terminal of the first IIR filter, a register of the second IIR filter is updated with a value determined by an output of the first IIR filter and by a previous output value of the second IIR filter stored in the register of the second IIR filter.

10. The filter circuit of claim 1, wherein the second stage of the filter circuit is configured to operate in a tracking mode when no transient is detected in the input signal to the first IIR filter, wherein during the tracking mode, for each input sample at the input terminal of the first IIR filter, a register of the second IIR filter is updated with a value determined by an output of the first IIR filter and by a previous output value of the second IIR filter stored in the register of the second IIR filter.

11. The filter circuit of claim 10, wherein during the tracking mode, for each input sample at the input terminal of the first IIR filter, the register of the second IIR filter is updated with a value equal to a linear combination of the output of the first IIR filter and the previous output value of the second IIR filter.

12. A system comprising:
a microelectromechanical systems (MEMS) sensor;
a filter network comprising:
  a first infinite impulse response (IIR) filter, an input terminal of the first IIR filter coupled to an output terminal of the MEMS sensor;
  a third IIR filter, an output terminal of the third IIR filter coupled to an output terminal of the filter network; and
  a second IIR filter coupled between the first IIR filter and the third IIR filter, wherein the first IIR filter, the second IIR filter, and the third IIR filter are first-order IIR filters, wherein the second IIR filter is configured to operate in a first mode or a second mode, wherein the filter network has a first convergence speed when the second IIR filter operates in the first mode, and the filter network has a second convergence speed slower than the first convergence speed when the second IIR filter operates in the second mode, wherein in the first mode, for each input sample of the filter network, a register of the second IIR filter is loaded with a value that is a scaled version of an output of the first IIR filter; and
a monitor circuit coupled to the filter network, wherein the monitor circuit is configured to:
  detect a transient in an input signal at the input terminal of the first IIR filter; and
  set the second IIR filter to operate in the first mode in response to detecting the transient.

13. The system of claim 12, wherein the monitor circuit is further configured to set the second IIR filter to operate in the second mode when no transient in the input signal at the input terminal of the first IIR filter is detected.

14. The system of claim 12, wherein in the second mode, for each input sample of the filter network, the register of the second IIR filter is updated with a value determined by an output of the first IIR filter and by a previous output of the second IIR filter.

15. The system of claim 12, wherein in the first mode, the register of the second IIR filter is loaded with the value that is a scaled version of an output of the first IIR filter only once.

16. The system of claim 15, wherein the register of the second IIR filter is loaded with the value at the end of the first mode, before the second IIR filter is switched from the first mode to the second mode.

17. The system of claim 12, wherein the monitoring circuit is configured to detect the transient by:
  computing a difference between an output of the third IIR filter and a scaled version of an output of the first IIR filter; and
  declaring detection of the transient when the computed difference is larger than a pre-determined threshold.

18. The system of claim 17, wherein the scaled version of the output of the first IIR filter is a value equal to the output of the first IIR filter multiplied with a combined DC gain, wherein the combined DC gain is equal to a multiplication of DC gains of all filters disposed between the first IIR filter and an output terminal of the third IIR filter.

19. A method of operating a filter network, the filter network comprising a first infinite impulse response (IIR) filter, a second IIR filter, and a third IIR filter coupled in series, with the second IIR filter coupled between the first IIR filter and the third IIR filter, wherein the first IIR filter, the second IIR filter, and the third IIR filter are first-order IIR filters, wherein the method comprises:
  monitoring an input signal and an output signal of the filter network;
  detecting a transient in the input signal of the filter network; and
  in response to detecting the transient, operating the second IIR filter in an acquisition mode, wherein operating the second IIR filter in the acquisition mode comprises:
    for each input sample of the filter network, loading a scaled value of an output of the first IIR filter into a register of the second IIR filter.

20. The method of claim 19, wherein the scaled value is computed by multiplying the output of the first IIR filter with a gain of the second IIR filter.

21. The method of claim 19, further comprising operating the second IIR filter in a tracking mode when no transient is detected, wherein in the tracking mode, for each input sample of the filter network, the register of the second IIR filter is updated with a value determined by the output of the first IIR filter and by a previous output of the second IIR filter.

* * * * *